(12) United States Patent
Lu et al.

(10) Patent No.: US 10,777,608 B2
(45) Date of Patent: Sep. 15, 2020

(54) RRAM PROCESS INTEGRATION SCHEME AND CELL STRUCTURE WITH REDUCED MASKING OPERATIONS

(71) Applicant: Hefei Reliance Memory Limited, Hefei (CN)

(72) Inventors: Zhichao Lu, San Jose, CA (US); Brent Steven Haukness, Monte Sereno, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 16/349,255

(22) PCT Filed: Nov. 13, 2017

(86) PCT No.: PCT/US2017/061393
§ 371 (c)(1),
(2) Date: May 10, 2019

(87) PCT Pub. No.: WO2018/089936
PCT Pub. Date: May 17, 2018

(65) Prior Publication Data
US 2019/0288037 A1   Sep. 19, 2019

Related U.S. Application Data

(60) Provisional application No. 62/421,779, filed on Nov. 14, 2016, provisional application No. 62/490,222, filed on Apr. 26, 2017.

(51) Int. Cl.
*H01L 27/24* (2006.01)
*H01L 45/00* (2006.01)
(Continued)

(52) U.S. Cl.
CPC .......... *H01L 27/2463* (2013.01); *G11C 7/12* (2013.01); *G11C 13/003* (2013.01);
(Continued)

(58) Field of Classification Search
CPC .......... G11C 2213/52; G11C 2213/77; H01L 27/2463; H01L 27/2472; H01L 45/146
(Continued)

(56) References Cited

U.S. PATENT DOCUMENTS

| 2004/0159867 A1 | 8/2004 | Kinney et al. |
| 2006/0215445 A1 | 9/2006 | Baek et al. |

(Continued)

OTHER PUBLICATIONS

Extended European Search Report dated Oct. 25, 2019, issued in related European Application No. 17870192.6 (12 pages).
(Continued)

*Primary Examiner* — Long K Tran
(74) *Attorney, Agent, or Firm* — Sheppard Mullin Richter & Hampton LLP

(57) ABSTRACT

Disclosed is a resistive random access memory (RRAM). The RRAM includes a bottom electrode made of tungsten and a switching layer made of hafnium oxide disposed above the bottom electrode, wherein the switching layer includes a switchable filament. The RRAM further includes a resistive layer disposed above the switching layer and a bit line disposed above the resistive layer, wherein the resistive layer extends laterally to connect two or more memory cells along the bit line.

14 Claims, 4 Drawing Sheets

(51) Int. Cl.
  *G11C 7/12* (2006.01)
  *G11C 13/00* (2006.01)
(52) U.S. Cl.
  CPC ...... *G11C 13/0007* (2013.01); *H01L 27/2472* (2013.01); *H01L 45/08* (2013.01); *H01L 45/12* (2013.01); *H01L 45/1233* (2013.01); *H01L 45/1253* (2013.01); *H01L 45/146* (2013.01); *H01L 45/1608* (2013.01); *H01L 45/1675* (2013.01); *G11C 2213/52* (2013.01); *G11C 2213/77* (2013.01)
(58) Field of Classification Search
  USPC .......................................................... 257/4
  See application file for complete search history.

(56) References Cited

U.S. PATENT DOCUMENTS

| | | | |
|---|---|---|---|
| 2011/0175053 A1 | 7/2011 | Fukumizu et al. | |
| 2013/0001501 A1 | 1/2013 | Sills | |
| 2013/0064002 A1 | 3/2013 | Terai | |
| 2013/0221307 A1* | 8/2013 | Wang | H01L 45/16 257/2 |
| 2014/0104932 A1 | 4/2014 | Srinivasan et al. | |
| 2014/0153318 A1* | 6/2014 | Perner | G11C 11/1673 365/148 |
| 2014/0246641 A1 | 9/2014 | Jameson, III et al. | |
| 2015/0144859 A1 | 5/2015 | Chen et al. | |
| 2015/0364679 A1* | 12/2015 | Molas | H01L 45/1233 257/4 |
| 2016/0111637 A1* | 4/2016 | Molas | G11C 13/0011 438/382 |

OTHER PUBLICATIONS

PCT International Search Report and the Written Opinion dated Jan. 17, 2018, issued in related International Application No. PCT/US2017/061393 (10 pages).

\* cited by examiner

RRAM PROCESS INTEGRATION SCHEME AND CELL STRUCTURE WITH REDUCED MASKING OPERATIONS

CROSS REFERENCE TO RELATED APPLICATIONS

This application is a national stage application under 35 U.S.C. § 371 of PCT Application No. PCT/US2017/061393, filed on Nov. 13, 2017, which is based on and claims priority to U.S. Provisional Patent Application No. 62/421,779, filed on Nov. 14, 2016, and based on and claims priority to U.S. Provisional Patent Application No. 62/490,222, filed on Apr. 26, 2017. The above-referenced applications are incorporated herein by reference in their entirety.

BACKGROUND

Non-volatile memory is a type of memory device that can store information even after loss of power. Non-volatile memory (NVM) devices can be read only memory or random access memory (RAM) and may use various technologies. One category of non-volatile RAM is resistive RAM, including technologies such as filamentary resistive random access memory (RRAM or ReRAM) cells, interfacial RRAM cells, magnetoresistive RAM (MRAM) cells, phase change memory (PCM) cells (e.g., chalcogenides including alloys of germanium, antimony, and tellurium), memristor memory elements, and programmable metallization cells (e.g., conductive bridging RAM (CBRAM) cell). The RRAM cell is a promising non-volatile memory device for embedded and standalone applications due to its fast operation time and low power performance.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
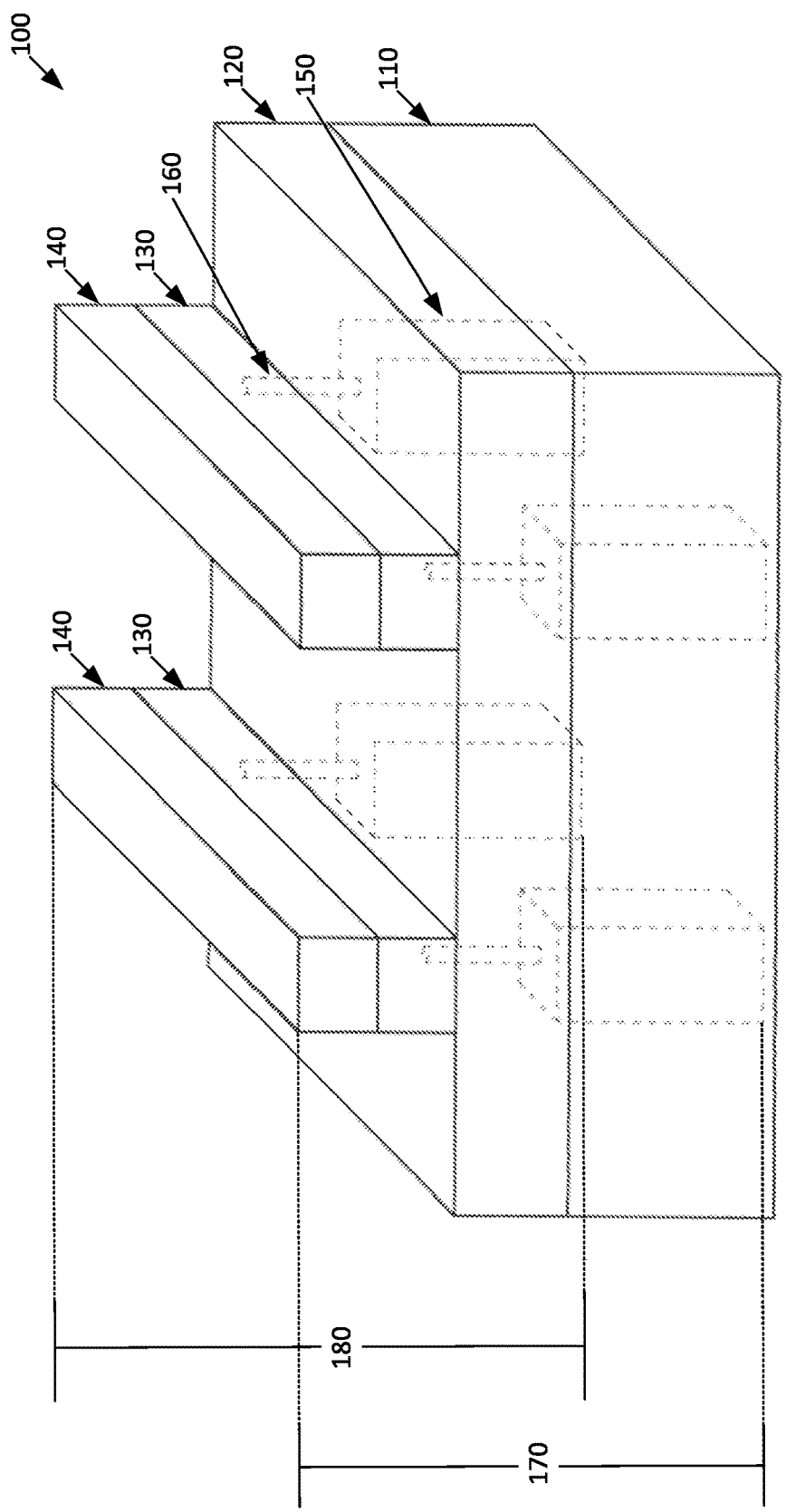
FIG. 1 illustrates a resistive random access memory (RRAM) structure having a switching layer that is a planar sheet, according to an embodiment.

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. However, it will be apparent to one skilled in the art that the present disclosure may be practiced without the specific details. In other instances, well-known features are omitted or simplified in order not to obscure the illustrative embodiments. Although various embodiments described herein are described with respect to RRAM cells, in other embodiments, these technologies can be used in other filamentary RAM technologies, including, for example, CBRAM cells, interfacial RRAM cells, MRAM cells, PCM cells, or other programmable metallization cells.

Resistive random-access memory (RRAM) is a type of non-volatile random-access memory. An RRAM structure includes a bottom electrode that is formed of a conductive material. The RRAM structure further includes a switchable layer disposed above the bottom electrode. When a voltage is applied to the switchable layer, one or more oxygen vacancies (e.g., switchable filaments) may be formed in the switchable layer. The oxygen vacancies may provide a conductive path across the switchable layer. Therefore, the switchable layer may be in a low resistance state when oxygen vacancies are formed. Conversely, the switchable layer may be in a high resistance state when the oxygen vacancies are broken (e.g., reset). A resistive layer may be disposed above the switchable layer.

Memory cells of the RRAM structure (also referred to as "RRAM cells" hereafter) may be formed at an intersection of a bit line and a word line or above vias of a semiconductor device. The RRAM cells may be formed using an etching or plasma process. A masking material may be applied to a portion of the upper surface of the resistive layer that resists an etching chemical or plasma. The switching layer and resistive layer may be exposed to the etching chemical or plasma to form the RRAM cells. Following the etching or plasma process, a top electrode layer may be disposed above the resistive layer and a masking material may be applied to a portion of the upper surface of the top electrode layer. Then a second etching or plasma process may be performed on the top electrode layer to form top electrodes (e.g., bit lines) of the RRAM structure. In order to form the individual RRAM cells of the RRAM structure, multiple masking operations may be performed, increasing the cost to produce and manufacture the RRAM structure as well as the complexity of the manufacturing process. Furthermore, the etching or plasma process may leave extra material around the RRAM cells, causing cell edge effects that decrease RRAM cell performance and uniformity.

Embodiments of the present disclosure can address the above-mentioned and other deficiencies by extending the resistive layer laterally across multiple memory cells of a bit line, reducing the number of masking and etching operations required to produce an RRAM structure to a single masking and etching operation. The top electrode layer may be disposed above the resistive layer without performing a masking and etching operation on the resistive layer. Then, a single masking and etching operation may be performed on the top electrode layer and the resistive layer, reducing the cost to produce and manufacture the RRAM structure. Furthermore, by reducing the amount of material that may be removed by the etching or plasma process, the amount of extra material present around the RRAM cells after the etching operation may decrease, reducing cell edge effects and improving cell performance and uniformity. Embodiments of the present disclosure may provide other benefits in addition to those previously discussed.

FIG. 1 illustrates an RRAM structure 100 having a switching layer that is a planar sheet in accordance with an embodiment. The RRAM structure 100 may include a semiconductor structure 110. The semiconductor structure may include vias 150 that serve as vertically conductive paths between a switching layer 120 and underlying components of the semiconductor device 110. In one embodiment, the vias 150 may be made of a conductive material. Examples of conductive materials include, but are not limited to, copper, gold, silver, tungsten or similar materials. Forming the vias 150 from tungsten may improve the performance of the RRAM structure 100 because the tungsten is easily oxidized (e.g., oxygen is trapped by the tungsten to form tungsten oxide) when the switching layer 120 is switching between a high resistance state and a low resistance state and vice versa, as will be discussed in more detail below. In some embodiments, the tungsten oxidation may be controlled using optimized algorithms to improve the endurance of the RRAM structure 100.

A switching layer 120 may be disposed above the semiconductor device and the vias 150. The switching layer 120 may be disposed using chemical vapor deposition (CVD), atomic layer deposition (ALD) or any suitable method. In one embodiment, the switching layer 120 may be made of a dielectric material, such as a transition metal oxide (TMO). Examples of TMO's include, but are not limited to, stoichiometric Hafnium Oxide (HfOx), stoichiometric Tantalum Oxide (TaOx), or other similar materials. The switching layer 120 may include one or more oxygen vacancies 160 that may serve as a conductive path through the switching layer 120. In one embodiment, the oxygen vacancies 160 may serve as a conductive path between vias 150 and a resistive layer 130. In some embodiments, rather than forming an oxygen vacancy 160 when a voltage is applied to the switching layer 120, a metallic conductive filament may be formed. The oxygen vacancies 160 may be formed by applying a voltage to the switching layer 120. The switching layer 120 may have a resistance value, where the resistance value may change upon application of a voltage. For example, the switching layer 120 may switch between a high resistance state and a low resistance state when a voltage is applied. In one embodiment, the high resistance state may be between 100-500 kiloohms and the low resistance state may be between 10-30 kiloohms, inclusively. In some embodiments, a ratio of the high resolution state to the low resistance state may be greater than 1. For example, if the resistance of the high resolution state is 100 kiloohms and the resistance in the low resolution state is 10 kiloohms, the ratio may be 10 (e.g., 100 kiloohms/10 kiloohms). In some embodiments, the ratio of the high resistance state to the low resistance state may be greater than 10. In one embodiment, the switching layer 120 may be a planar sheet disposed above the semiconductor device 110 and vias 150.

A resistive layer 130 may be disposed above the switching layer 120. The resistive layer 130 may be disposed using CVD, ALD or any suitable method. In one embodiment, the resistive layer 130 may be a conductive material. In another embodiment, the resistive layer 130 may be a conductive metal oxide (CMO). The resistive layer 130 may extend laterally to connect to two or more vias 150 through the switching layer 120. In some embodiments, each via 150 may correspond to a memory cell and the resistive layer 130 may extend laterally to connect two or more memory cells along the top electrode 140. In one embodiment, the vias 150 may connect to the drains of N-type metal-oxide semiconductor (NMOS) transistors. A top electrode 140 may be disposed above the resistive layer 130. The top electrode 140 may be a conductive material. Examples of conductive materials include, but are not limited to, aluminum, copper or any similar materials. The top electrode 140 may be disposed above the resistive layer 130 using CVD, ALD or any suitable method to form memory cells 170, 180 at the intersection of vias 150 and top electrodes 140. The top electrode 140 may extend laterally along the resistive layer 130. In some embodiments, the top electrode 140 may be a bit line and the resistive layer 130 may connect two or more memory cells along the bit line. For example, the resistive layer 130 and top electrode 140 may extend laterally to connect memory cell 170 to memory cell 180. In some embodiments the top electrode 140 corresponds to a standard metallization layer used for other connections on the semiconductor device. Although embodiments of the present disclosure illustrate the switching layer 120 and resistive layer 130 between a via 150 and a top electrode 140, in other embodiments the switching layer 120 and resistive layer 130 may be located between any via and any metal layer of a semiconductor structure.

Figure 2:
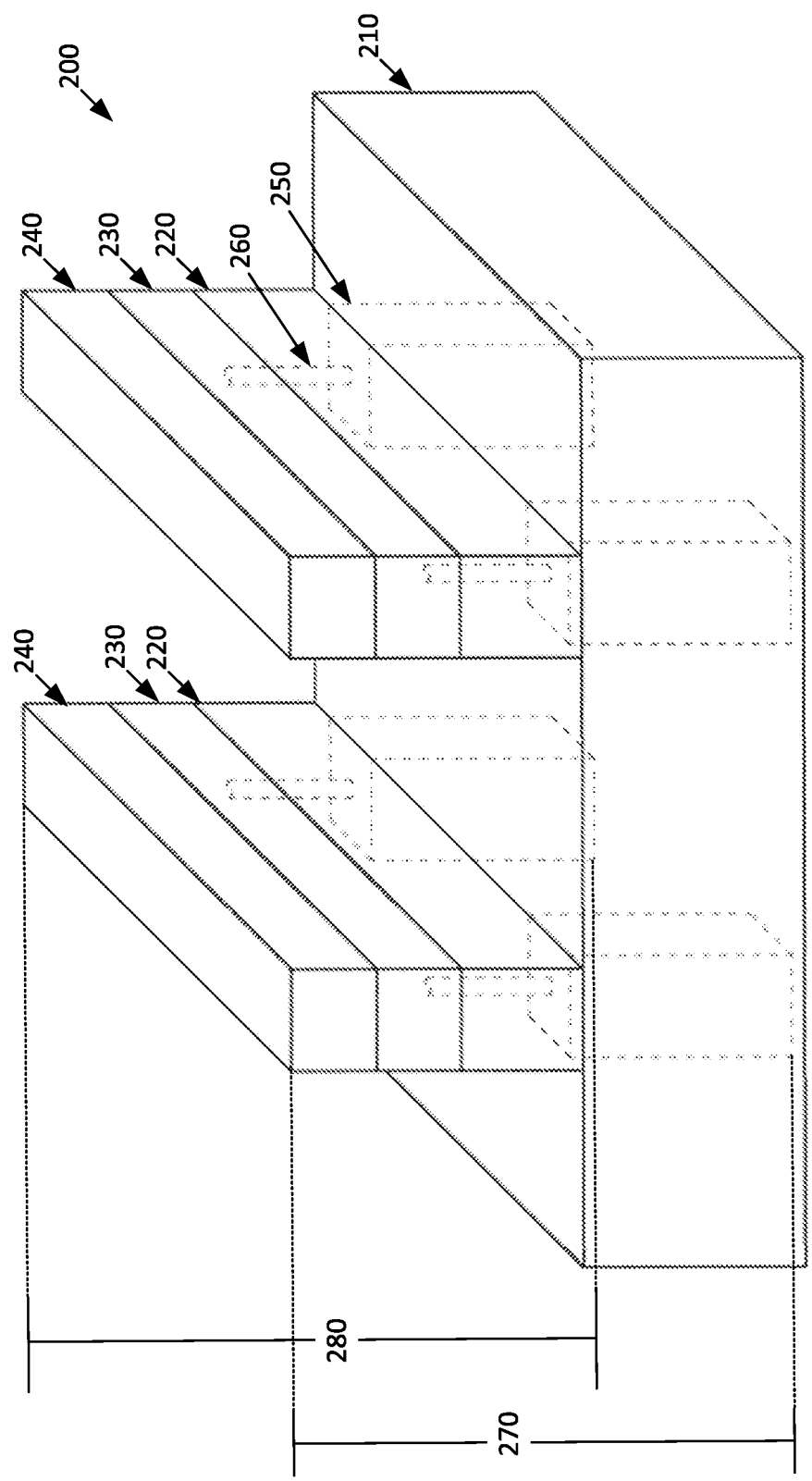
FIG. 2 illustrates an RRAM structure having a switching layer that extends laterally, according to an embodiment.

FIG. 2 illustrates an RRAM structure 200 having a switching layer that extends laterally in accordance with an embodiment. The RRAM structure 200 may include a semiconductor structure 210. The semiconductor structure may include vias 250 that serve as vertically conductive paths between a switching layer 220 and underlying components of the semiconductor device 210. In one embodiment, the vias 250 may be made of a conductive material, such as tungsten. A switching layer 220 may be disposed above the semiconductor device and the vias 250. The switching layer 220 may be disposed using CVD, ALD or any suitable method. In one embodiment, the switching layer 220 may be a dielectric material. In another embodiment, the switching layer 220 may be a TMO. In further embodiments, the switching layer 220 may be HfOx, TaOx, TiOx or other similar materials. The switching layer 220 may include one or more oxygen vacancies 260 that may serve as a conductive path through the switching layer 120. The oxygen vacancies 260 may be formed by applying a voltage to the switching layer 220. The switching layer 220 may have a resistance value that changes upon application of a voltage. For example, the switching layer 220 may switch between a high resistance state and a low resistance state when a voltage is applied. In one embodiment, the switching layer 220 may extend laterally above two or more vias 250.

A resistive layer 230 may be disposed above the switching layer 220. The resistive layer 230 may be disposed using CVD, ALD or other method. In one embodiment, the resistive layer 230 may be a conductive material. In another embodiment, the resistive layer 230 may be a CMO. The resistive layer 230 may extend laterally to connect to two or more vias 250 through switching layer 220. In some embodiments, each via 250 may correspond to a memory cell and the resistive layer 230 may extend laterally to connect two or more memory cells along the top electrode 240. In one embodiment, the vias 250 may connect to a drain of an N-type metal-oxide semiconductor (NMOS) transistor. A top electrode 240 may be disposed above the resistive layer 230. The top electrode 240 may be a conductive material. Examples of conductive materials include, but are not limited to, aluminum, copper, or any similar materials. The top electrode 240 may be disposed above the resistive layer 230 using CVD, ALD or any suitable method to form memory cells 270, 280 at the intersection of vias 250 and top electrodes 240. The top electrode 240 may extend laterally along the resistive layer 230. In some embodiments, the top electrode 240 may be a bit line and the resistive layer 230 may connect two or more memory cells along the bit line. For example, the resistive layer 230 and top electrode 240 may extend laterally to connect memory cell 270 to memory cell 280. In some embodiments the top electrode 240 corresponds to a standard metallization layer used for other connections on the semiconductor device. Although embodiments of the present disclosure illustrate the switching layer 220 and resistive layer 230 between a via 250 and a top electrode 240, in other embodiments the switching layer 220 and resistive layer 230 may be located between any via and any metal layer of a semiconductor structure.

Figure 3:
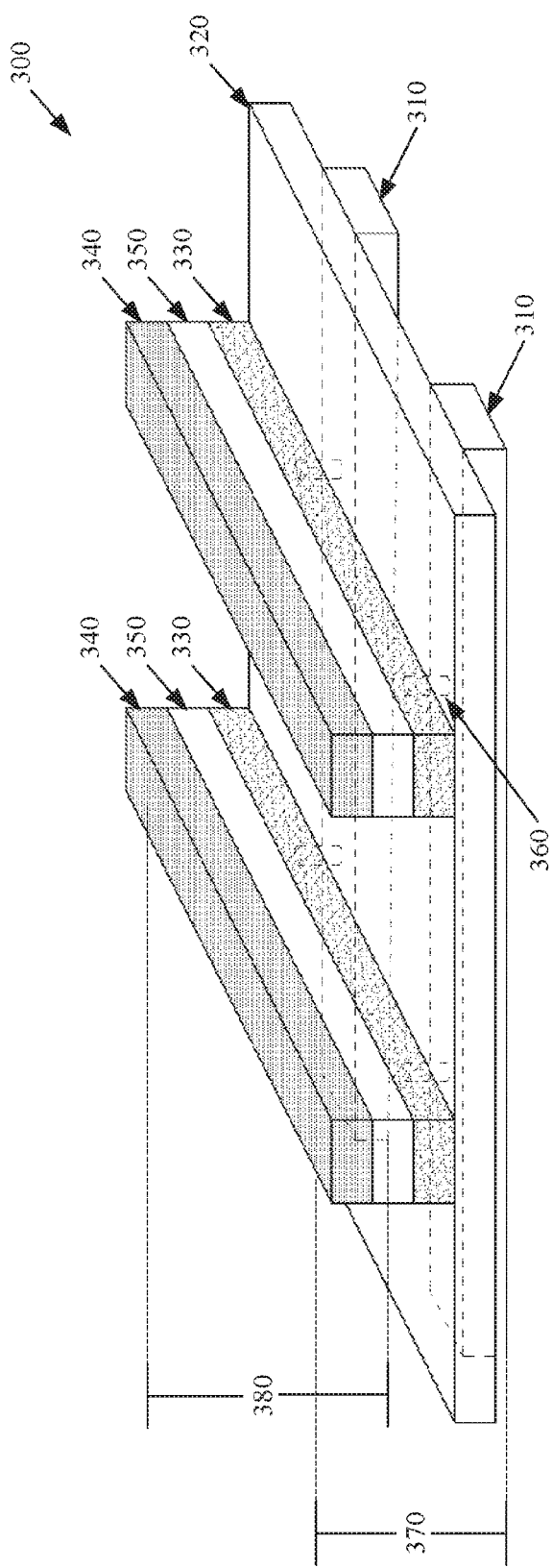
FIG. 3 illustrates an RRAM structure having a non-linear device layer, according to an embodiment.

FIG. 3 illustrates an RRAM structure 300 having a non-linear device layer in accordance with an embodiment. The RRAM structure 300 may include word lines 310. The word lines 310 may be made of a conductive material and may connect the gates of transistors for an array segment. Examples of conductive materials include, but are not limited to, copper, tungsten or any similar material. The word lines 310 may be orthogonal to bit lines 340, which will be discussed in more detail below. A switching layer 320 may be disposed above the bottom electrodes 310. The switching layer 320 may be disposed using CVD, ALD or any suitable method. In one embodiment, the switching layer 320 may be a dielectric material. In another embodiment, the switching layer 320 may be a TMO. In further embodiments, the switching layer 320 may be HfOx, TaOx, TiOx or other similar materials. The switching layer 320 may include one or more oxygen vacancies 360 that may serve as a conductive path through the switching layer 320. The oxygen vacancies 360 may be formed by applying a voltage to the switching layer 320. The switching layer 320 may have a resistance value that changes upon application of a voltage. For example, the switching layer 320 may switch between a high resistance state and a low resistance state when a voltage is applied. Although the switching layer 320 may be illustrated as a planar sheet, in some embodiments the switching layer 320 may extend laterally along bit lines 340 as shown in FIG. 2. A resistive layer 330 may be disposed above the switching layer 320. The resistive layer 330 may be disposed using CVD, ALD or any suitable method. In one embodiment, the resistive layer 330 may be a conductive material. In another embodiment, the resistive layer 330 may be a CMO. The resistive layer 330 may extend laterally to connect to two or more memory cells along bit lines 340. For example, the resistive layer 330 and bit line 340 may extend laterally to connect memory cell 370 to memory cell 380.

A non-linear device layer 350 may be disposed above the resistive layer 330. The non-linear device layer 350 may exhibit a high resistance for a particular range of voltages and a low resistance range for voltages above and below the particular range of voltages. In one embodiment, the range of voltage may be less than three volts. The non-linear device layer 350 may cause the RRAM structure 300 to exhibit a non-linear resistive characteristic. In some embodiments, the non-linear device layer 350 may be disposed below the switching layer 320 and the word line 310. In one embodiment, the non-linear device layer 350 may be two oppositely oriented diodes connected in series. When the diodes are oppositely oriented, one diode's forward current may be blocked by the other diode at voltages in the particular range of voltages. The particular range of voltages may correspond to a breakdown voltage of the diodes, where the breakdown voltage may be the minimum voltage that causes a portion of the diodes to become electrically conductive. In another embodiment, the non-linear device layer 350 may be a metal-insulator-metal (MIM) tunneling device. A bit line 340 may be disposed above the resistive layer 330. The bit line 340 may be a conductive material. The bit line 340 may be disposed above the resistive layer 330 using CVD, ALD or any suitable method to form memory cells 370, 380 at the intersection of word lines 310 and bit lines 340. The bit line 340 may extend laterally along the resistive layer 330.

Figure 4:
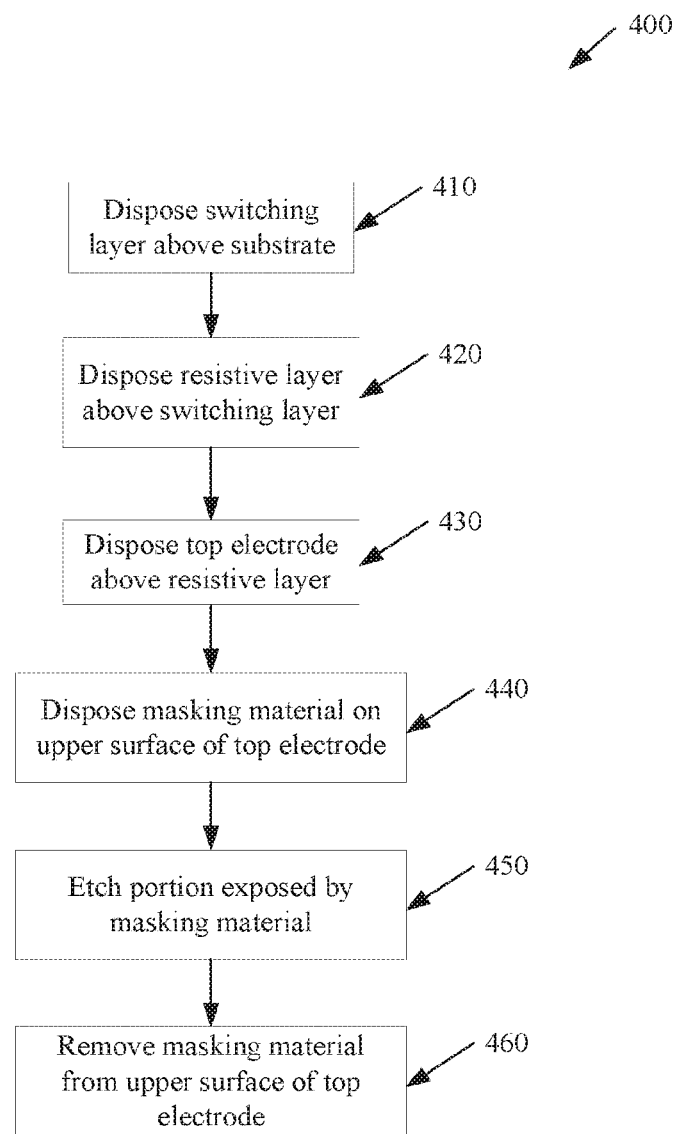
FIG. 4 is a flow diagram of a fabrication process for the manufacture of an RRAM structure, according to an embodiment.

FIG. 4 is a flow diagram of a fabrication process for the manufacture of an RRAM structure in accordance with an embodiment. It may be noted that elements of FIGS. 1-3 may be described below to help illustrate method 400. Method 400 may be performed as one or more operations. It may be noted that method 400 may be performed in any order and may include the same, more or fewer operations. It may be noted that method 400 may be performed by one or more pieces of semiconductor fabrication equipment or fabrication tools.

Method 400 begins at block 410 by disposing a switching layer above a substrate. In one embodiment, the substrate may be a semiconductor device including vias. In another embodiment, the switching layer may be disposed above word lines of a memory structure. The switching layer may be disposed by CVD, ALD or any suitable process. In one embodiment, the switching layer may be a dielectric material. In another embodiment, the switching layer may be a TMO. In further embodiments, the switching layer may be HfOx. At block 420, a resistive layer may be disposed above the switching layer. The resistive layer may be disposed by CVD, ALD or any suitable process. In one embodiment, the resistive layer may be a conductive material. In another embodiment, the resistive layer may be a CMO. At block 430, a top electrode layer may be disposed above the resistive layer. The top electrode layer may be disposed by CVD, ALD or any suitable process. In one embodiment, the top electrode layer may be a conductive material. Examples of conductive materials include, but are not limited to, gold, silver, copper, tungsten, or any other suitable material.

At block 440 a masking material may be disposed on the upper surface of the top electrode layer that resists an etching chemical or plasma. In one embodiment, the masking material may be disposed on portions of the upper surface of the top electrode layer to form a top electrode (e.g., bit lines) of a RRAM structure when exposed to the etching chemical or plasma. At block 450, the RRAM structure may be exposed to an etching chemical or plasma which may remove areas of the RRAM structure exposed by the masking material. In one embodiment, the etching or plasma process may only remove portions of the top electrode layer and the resistive layer, while the switching layer may remain a planar sheet. The top electrode and the resistive layer may extend laterally to connect multiple memory cells along a bit line. In another embodiment, the etching or plasma process may remove portions of the top electrode layer, the resistive layer and the switching layer. The top electrode, the resistive layer and the switching layer may extend laterally to connect multiple memory cells along a bit line. At block 460, the masking material may be removed from the upper surface of the top electrode.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. A resistive random access memory (RRAM) comprising:
   one or more bottom electrodes comprised of tungsten;
   one or more switching layers comprised of hafnium oxide disposed above the bottom electrode, the switching layer comprising a switchable filament;
   one or more resistive layers disposed above the switching layer;
   one or more bit lines disposed above the resistive layer, wherein the resistive layer extends laterally to connect two or more RRAM cells along the bit line; and
   further comprising a via disposed below the switching layer, wherein the via is directly in contact with the switching layer; wherein the via is comprised of tungsten.

2. The RRAM of claim 1, wherein the one or more resistive layers are comprised of a conductive metal oxide.

3. The RRAM of claim 1, wherein the one or more bottom electrodes comprise a word line that is orthogonal to the bit line.

4. The RRAM of claim 3, further comprising:
   one or more non-linear device layers disposed below the bit line and above the resistive layer.

5. The RRAM of claim 3, further comprising:
   one or more non-linear device layers disposed above the word line and below the switching layer.

6. The RRAM of claim 5, wherein the one or more non-linear device layers comprise a metal-insulator-metal structure.

7. A resistive random access memory (RRAM) comprising:
   a switching layer;
   a resistive layer disposed above the switching layer, wherein the resistive layer extends laterally to connect two or more memory cells along a bit line;
   a top electrode disposed above the resistive layer and
   further comprising a via disposed below the switching layer, wherein the via is directly in contact with the switching layer; wherein the via is comprised of tungsten.

8. The RRAM of claim 7, further comprising a bottom electrode disposed below the switching layer.

9. The RRAM of claim 7, wherein a material of the switching layer comprises a transition metal oxide.

10. The RRAM of claim 7, wherein a material of the switching layer comprises tantalum oxide.

11. The RRAM of claim 7, wherein a material of the switching layer comprises titanium oxide.

12. The RRAM of claim 7, wherein a material of the switching layer comprises hafnium oxide.

13. The RRAM of claim 7, wherein the top electrode corresponds to a standard metallization layer used for connections on a semiconductor device.

14. The RRAM of claim 7, wherein the switching layer has a resistance that changes upon application of a voltage.

* * * * *